(12) United States Patent
Abedifard

(10) Patent No.: US 6,747,898 B2
(45) Date of Patent: Jun. 8, 2004

(54) COLUMN DECODE CIRCUIT FOR HIGH DENSITY/HIGH PERFORMANCE MEMORIES

(75) Inventor: Ebrahim Abedifard, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/190,650

(22) Filed: Jul. 8, 2002

(65) Prior Publication Data

US 2004/0004860 A1 Jan. 8, 2004

(51) Int. Cl.$^7$ ................................................ G11C 16/06
(52) U.S. Cl. .......................... 365/185.23; 365/185.11; 365/185.13; 365/230.03; 365/230.06
(58) Field of Search ................. 365/51, 63, 185.11, 365/185.13, 185.23, 230.03, 230.06

(56) References Cited

U.S. PATENT DOCUMENTS

| | | | |
|---|---|---|---|
| 5,654,916 A | * | 8/1997 | Sato et al. ............. 365/185.06 |
| 5,835,441 A | | 11/1998 | Seyyedy et al. |
| 5,949,698 A | | 9/1999 | Shirley |
| 5,978,309 A | | 11/1999 | Seyyedy et al. |
| 5,999,480 A | | 12/1999 | Ong et al. |
| 6,094,396 A | * | 7/2000 | Zheng .................... 365/230.03 |
| 6,111,774 A | | 8/2000 | Shirley |
| 6,205,080 B1 | | 3/2001 | Seyyedy et al. |
| 6,246,632 B1 | | 6/2001 | Seyyedy et al. |
| 6,320,816 B2 | | 11/2001 | Seyyedy et al. |
| 6,366,524 B1 | | 4/2002 | Abedifard |
| 6,396,728 B1 | | 5/2002 | Abedifard et al. |
| 6,449,210 B1 | | 9/2002 | Manning |
| 6,480,408 B1 | | 11/2002 | Shirley |
| 2001/0009529 A1 | | 7/2001 | Seyyedy et al. |
| 2001/0036120 A1 | | 11/2001 | Huber |
| 2002/0074592 A1 | | 6/2002 | Abedifard |
| 2002/0109138 A1 | | 8/2002 | Forbes |
| 2002/0125538 A1 | | 9/2002 | Abedifard et al. |

* cited by examiner

Primary Examiner—Son Mai
(74) Attorney, Agent, or Firm—Leffert Jay & Polglaze, P.A.

(57) ABSTRACT

An improved memory device column decode apparatus and method is described that incorporates a reduced logic level column address decoder that fully decodes the column address and couples individual sense amplifiers to input or output busses with single pass transistors to provide for increased operation speed and lower sense amplifier resistance. The improved memory device column decode apparatus and method reduces column decode circuit and memory array size allowing for efficient memory array sizing and implementation. Additionally, the improved memory device column decode apparatus and method can incorporate fully decoded column select lines on a separate process layer of the memory array further reducing implementation size.

61 Claims, 11 Drawing Sheets

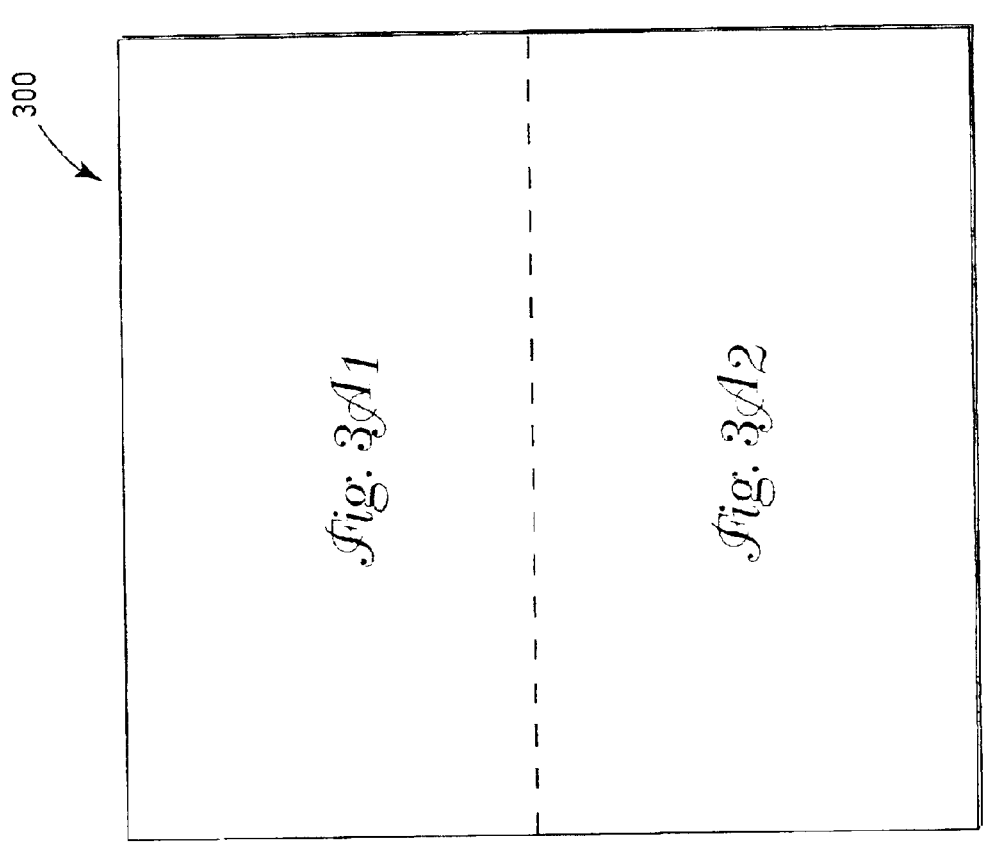

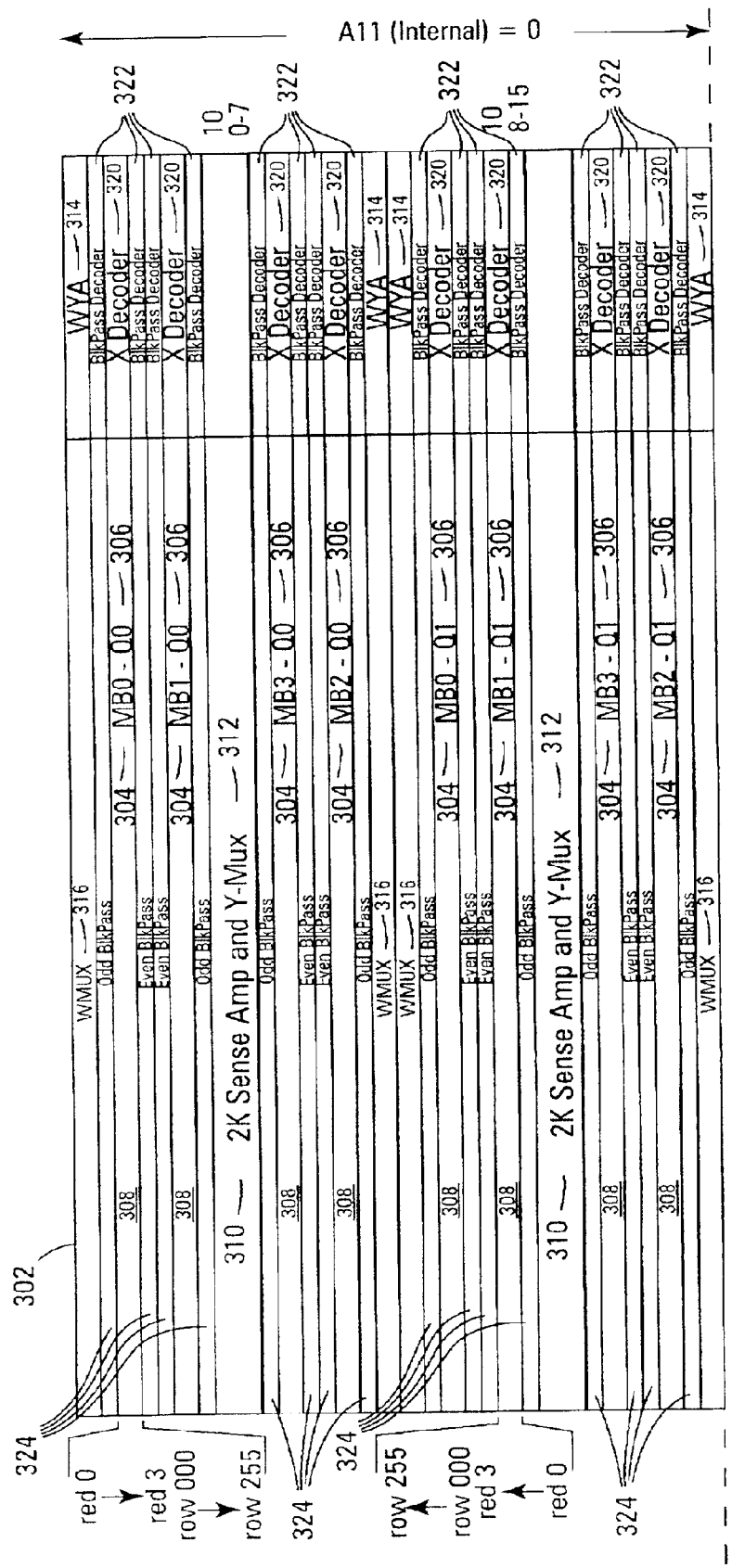
fig. 3A1

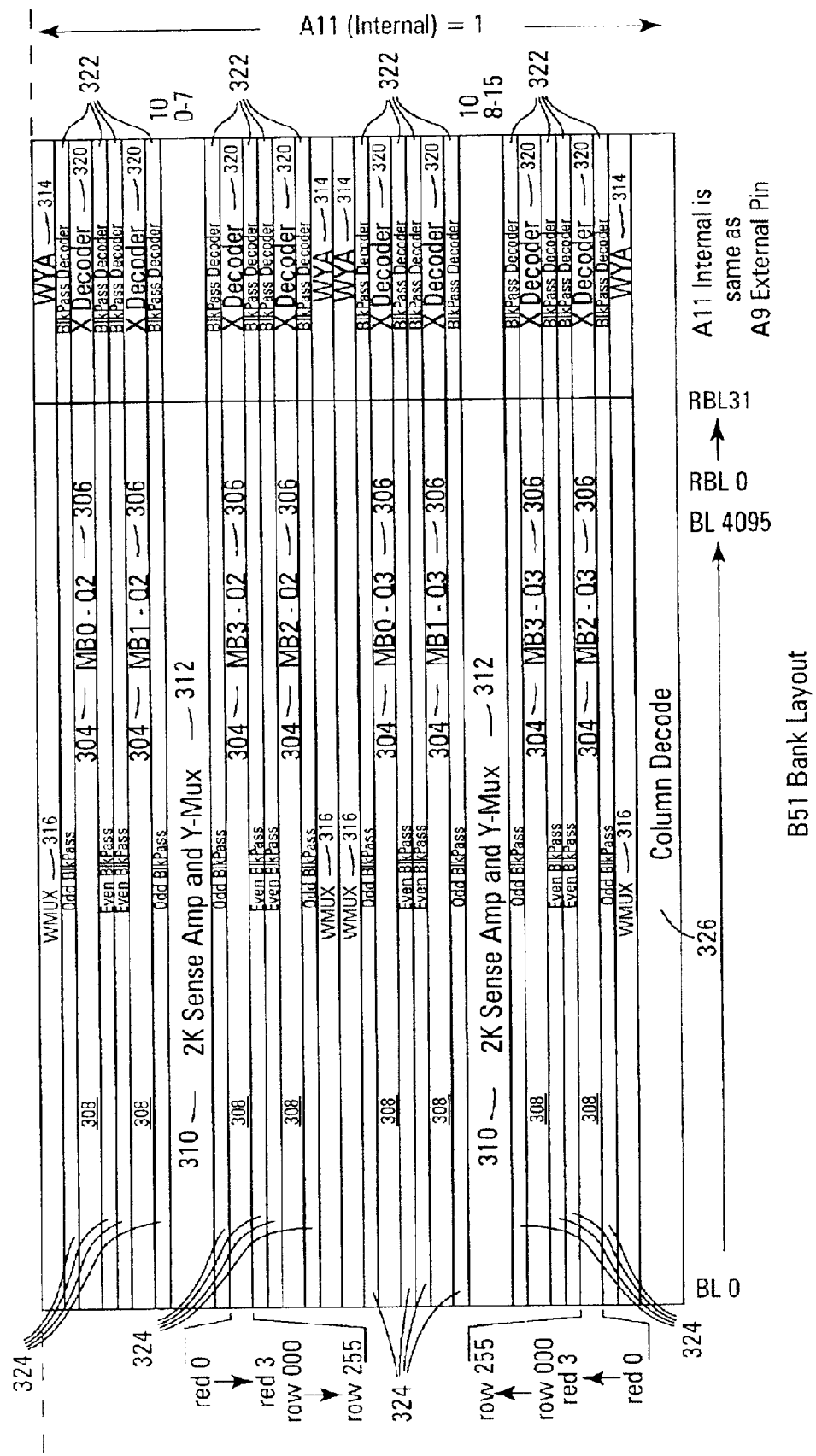
Fig. 3A2

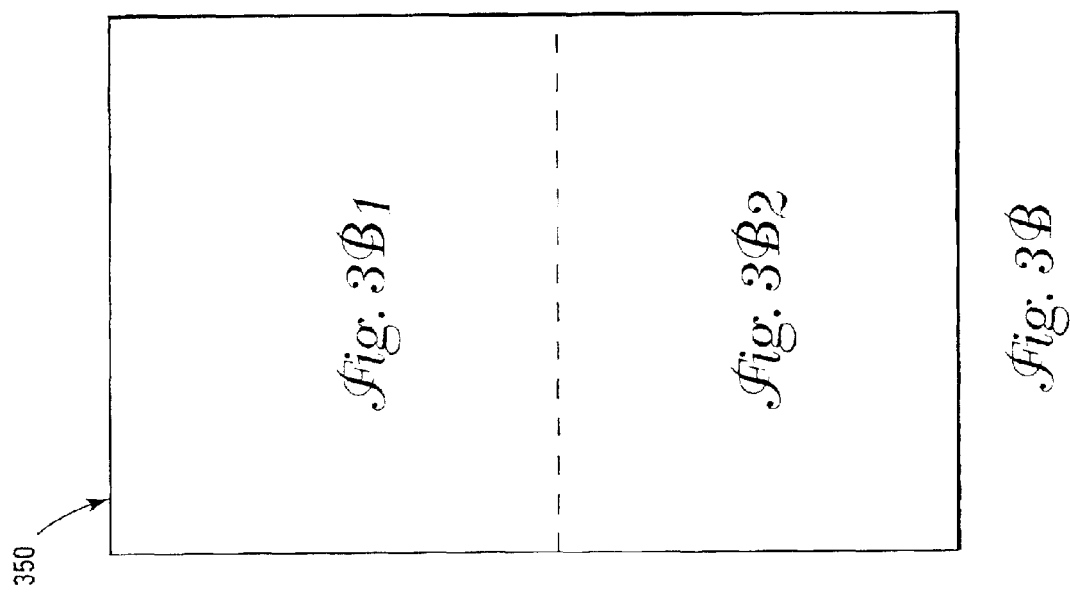

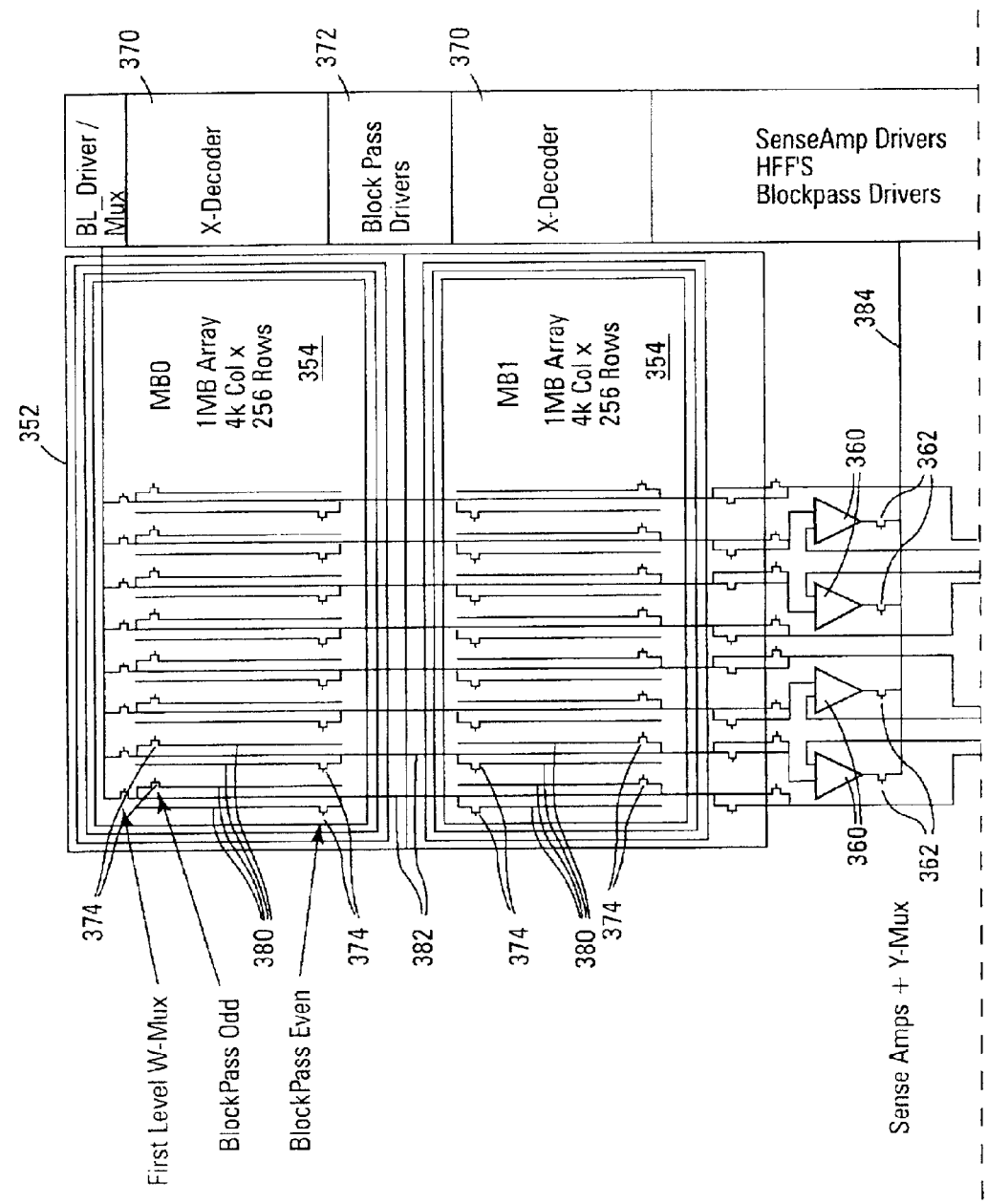
Fig. 3B1

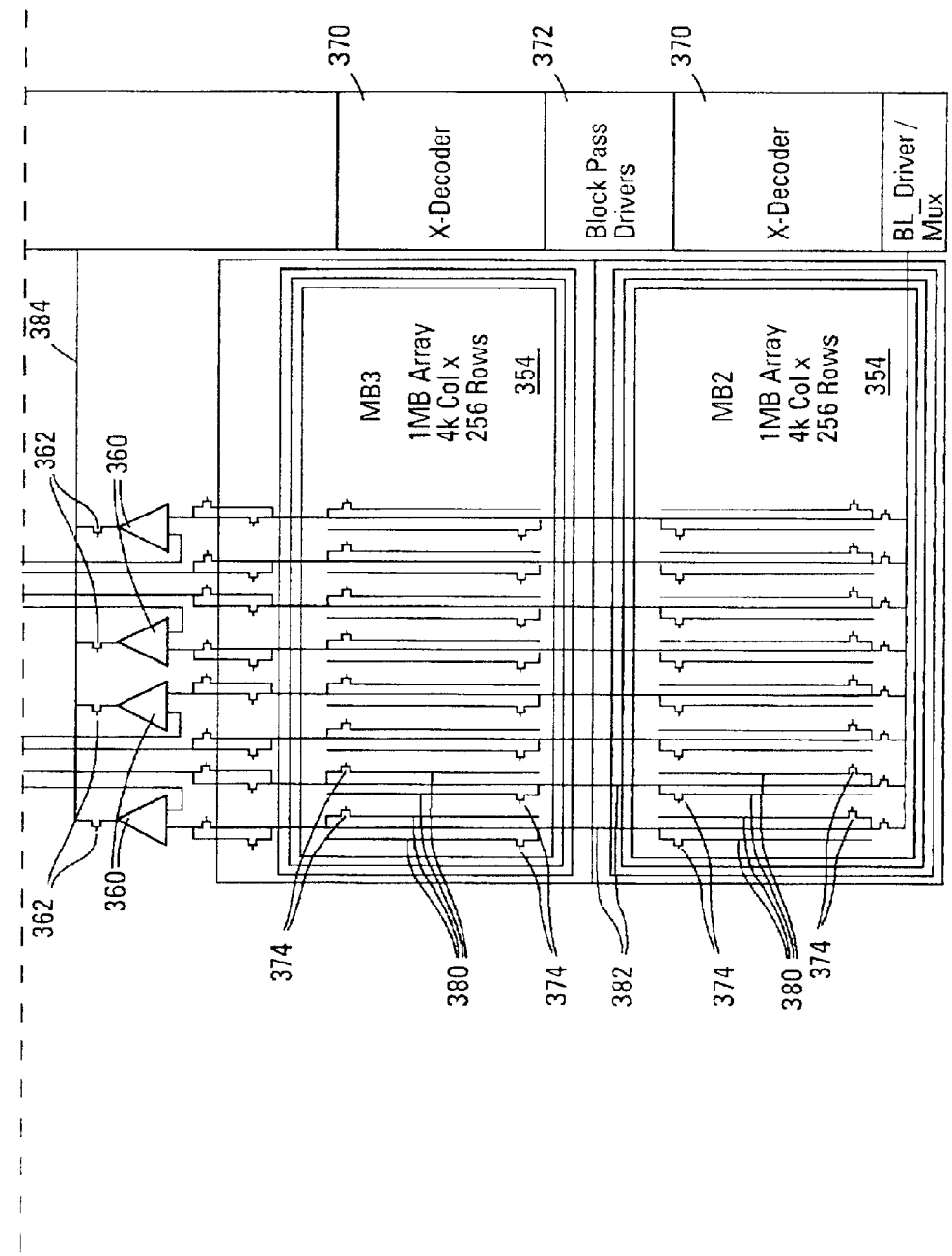
Fig. 3B2

COLUMN DECODE CIRCUIT FOR HIGH DENSITY/HIGH PERFORMANCE MEMORIES

TECHNICAL FIELD OF THE INVENTION

The present invention relates generally to integrated circuits and in particular the present invention relates to column decode circuits in memory arrays.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively.

Yet another type of non-volatile memory is a Flash memory. A Flash memory is a type of EEPROM that can be erased and reprogrammed in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks". Each of the cells within an erase block can be electrically programmed in a random basis by charging the floating gate. The charge can be removed from the floating gate by a block erase operation, wherein all floating gate memory cells in the erase block are erased in a single operation. For ease of access and management the erase blocks of a non-volatile memory device are typically arranged in "banks" or segments.

Many modern PCs have their BIOS stored on a flash memory chip so that it can easily be updated if necessary. Such a BIOS is sometimes called a Flash BIOS. Flash memory is also popular in modems because it enables the modem manufacturer to support new protocols as they become standardized.

Both RAM and ROM random access memory devices have memory cells that are typically arranged in an array of rows and columns. During operation, a row (page) is accessed and then memory cells can be randomly accessed on the page by providing column addresses. This access mode is referred to as page mode access. To read or write to multiple column locations on a page requires the external application of multiple column addresses. To increase access time, a burst mode access has been implemented. The burst mode uses an internal column address counter circuit to generate additional column addresses. The address counter begins at an externally provided address and advances in response to an external clock signal or a column address strobe signal.

A synchronous DRAM (SDRAM) is a type of DRAM that can run at much higher clock speeds than conventional DRAM memory. SDRAM synchronizes itself with a CPU's bus and is capable of running at 100 MHZ or 133 MHZ, about three times faster than conventional FPM (Fast Page Mode) RAM, and about twice as fast EDO (Extended Data Output) DRAM and BEDO (Burst Extended Data Output) DRAM. A modern extended form of SDRAM, that can transfer a data value on the rising and falling edge of the clock signal, is called the double data rate SDRAM (DDR SDRAM, or simply, DDR). SDRAM's can be accessed quickly, but are volatile. Many computer systems are designed to operate using SDRAM, but would benefit from non-volatile memory. A synchronous Flash memory has been designed that allows for a non-volatile memory device with an SDRAM interface. Although knowledge of the function and internal structure of a synchronous Flash memory is not essential to understanding the present invention, a detailed discussion is included in U.S. patent application Ser. No. 09/627,682 filed Jul. 28, 2000 and titled, "Synchronous Flash Memory," which is commonly assigned and incorporated by reference.

FIG. 1 shows a simplified diagram of a system 128 incorporating a Flash memory 100 of the prior art coupled to a processing device or controller 102. The Flash memory 100 has an address interface 104, a control interface 106, and a data interface 108 that are each coupled to the processing device 102 to allow memory read and write accesses. Internally to the Flash memory device a control state machine 110 directs internal operation of the Flash memory device; managing the Flash memory array 112 and updating RAM control registers and non-volatile erase block management registers 114. The RAM control registers and tables 114 are utilized by the control state machine 110 during operation of the Flash memory 100. The Flash memory array 112 contains a sequence of memory banks or segments 116. Each bank 116 is organized logically into a series of erase blocks (not shown). Memory access addresses are received on the address interface 104 of the Flash memory 100 and divided into a row and column address portions. On a read access the row address is latched and decoded by row decode circuit 120, which selects and activates a row page (not shown) of memory cells across a selected memory bank. The bit values encoded in the output of the selected row of memory cells are coupled from a local bitline (not shown) to a global bitline (not shown) and detected by sense amplifiers 122 associated with the memory bank. The column address of the access is latched and decoded by the column decode circuit 124. The output of the column decode circuit selects the desired column data from the sense amplifier outputs and coupled to the data buffer 126 for transfer from the memory device through the data interface 108. On a write access the row decode circuit 120 selects the row page and column decode circuit selects write sense amplifiers 122. Data values to be written are coupled from the data buffer 126 to the write sense amplifiers 122 selected by the column decode circuit 124 and written to the selected floating gate memory cells (not shown) of the memory array 112. The written cells are then reselected by the row and column decode circuits 120, 124 and sense amplifiers 122 so that they can be read to verify that the correct values have been programmed into the selected memory cells.

Sense amplifiers of modern memory devices are typically incorporated internal to the memory arrays. Many modern memory architectures with dense memory arrays save on scarce circuit and routing resources by not fully decoding the column address before it is routed into the array proper, minimizing the number of column select lines and circuit resources they utilize routing through the array. Once the partially decoded column select lines are routed to the sense amplifiers in the interior of the memory array, the remainder of the column address is decoded to select the appropriate read and write sense amplifiers. Typically this decoding is accomplished by a series coupled sequence of pass transistors which selectively enable to pass the output of the desired sense amplifiers.

This partial decoding approach avoids the circuit and routing resource expense of a fully decoded column address approach. However, the partial decoding approach increases the number of "logic levels" of the resulting column decoder circuit, increasing complexity and overall circuit size. The additional logic levels of the partial decoding column decode circuit add additional circuit delay to the decoding of the asserted column address. Partial decoding also has the effect of increasing the resistance seen by the sense amplifiers by inserting multiple pass transistors into the input path of write sense amplifiers or output path of read sense amplifiers. With the faster access speeds of modern memory devices the additional delays of the partial column decoder circuit and pass transistors are more of an issue for modern memory devices.

For the reasons stated above, and for other reasons stated below which will become apparent to those skilled in the art upon reading and understanding the present specification, there is a need in the art for an improved memory column address decoding scheme.

SUMMARY OF THE INVENTION

The above-mentioned problems memory column address decoding in memory devices are addressed by the present invention and will be understood by reading and studying the following specification.

In one embodiment, a column decoder circuit comprises a memory array with a plurality of sense amplifiers, a decoder circuit adapted to receive and fully decode a column address, a plurality of column select lines coupled to the decoder circuit, wherein the column select lines are routed across the memory array and selectively couple the plurality of sense amplifiers to an array output bus by activating a single pass transistor coupled to each sense amplifier.

In another embodiment, a Flash memory Y-Mux circuit comprises a memory array with a plurality of sense amplifiers, an address interface coupled to an address decoder, and a plurality of decode lines coupled to the address decoder, wherein a single pass transistor is coupled to each sense amplifier and each decode line is coupled to at least one pass transistor.

In a yet another embodiment, a Flash memory device comprises a memory array containing a plurality of floating gate memory cells, an address interface coupled to a row address decoder and a column address decoder, and a plurality of column decode lines coupled to the column address decoder, wherein the column decode circuit is adapted to fully decode a column address and wherein each column decode line is coupled to a single pass transistor.

In a further embodiment, a non-volatile memory array comprises a plurality of sense amplifiers, an address decoder, and a plurality of decode lines coupled to the address decoder, wherein a single pass transistor is coupled to each sense amplifier and wherein each decode line is coupled to at least one pass transistor.

In yet a further embodiment, a Flash memory device comprises a memory array with a plurality of memory banks, wherein each memory bank has a plurality of read sense amplifiers and a plurality of write sense amplifiers, a data input bus coupled to a data buffer, wherein each write sense amplifier is coupled to the data input bus with a single pass transistor, a data output bus coupled to the data buffer, wherein each read sense amplifier is coupled to the data output bus with a single pass transistor, an address interface coupled to a row address decoder and a column address decoder, wherein the column address decoder is a single logic level and is adapted to fully decode the column address, and a plurality of column select lines coupled to the column address decoder, wherein each column select line is coupled to at least one pass transistor.

In another embodiment, a system comprises a processor, and a Flash memory device coupled to the processor. The Flash memory device includes a memory array, a memory array containing a plurality of floating gate memory cells, an address interface coupled to a row address decoder and a column address decoder, and a plurality of column decode lines coupled to the column address decoder, wherein the column decode circuit is adapted to fully decode a column address and wherein each column decode line is coupled to a single pass transistor.

In yet another embodiment, a method of operating a Flash memory device comprises receiving a memory access containing a memory address at a memory device, decoding the memory address with an address decoder, and accessing a memory array of the Flash memory device by activating at least one decode select line of a plurality of decode select lines, wherein each of the at least one decode select lines selectively couples at least one sense amplifier to a data bus with a pass transistor.

In a further embodiment, a method of making a Flash memory device comprises forming a memory array with a plurality of sense amplifiers that each couple to a data bus with a single pass transistor, forming an address interface, forming an address decode circuit coupled to the address interface, and forming a plurality of decode select lines each coupled to the address decoder and at least one of the pass transistors.

In yet a further embodiment, a method of operating a Flash memory device comprises receiving a memory access containing a column address at a memory device, fully decoding the column address with a column address decoder, accessing a memory array of the Flash memory device by activating at least one decode select line of a plurality of decode select lines, wherein each of the at least one decode select lines is routed through a metal process layer over the memory array and selectively couples at least one sense amplifier to a data bus with a Y-MUX.

In another embodiment, a Flash memory device comprises a memory array containing a plurality of floating gate memory cells, a plurality of bit lines, wherein each bit line is coupled to a sense amplifier and to a plurality of outputs of the plurality of floating gate memory cells, an address interface coupled to a row address decoder and a column address decoder, a plurality of column decode lines coupled to the column address decoder, wherein the column address decoder is adapted to fully decode a column address and wherein each column decode line is routed through a metal process layer of the memory array, and a Y-MUX, wherein each Y-MUX is coupled to one or more column decode lines and selectively couples a plurality of the sense amplifiers to a bus in response to an output of column address decoder coupled via the column decode lines.

BRIEF DESCRIPTION OF THE DRAWINGS

FIGS. 3A and 3B are simplified bank layout diagrams of Flash memory array of embodiments of the present invention.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

To deal with the above detailed issues of the number of "logic levels" of the resulting column decoder circuit and the resistance of the pass transistors that couple the sense read and write amplifiers to the data output or input bus respectively, embodiments of the present invention utilize an improved column decode circuit that couple the read and write sense amplifiers to the input and output data buses with single pass transistors to increase access speed and reduce output or input resistance. Embodiments of the present invention also fully decode the column address with a single logic level decoder circuit and route the fully decoded column address on select lines into the memory array, reducing the resulting decoder circuit size and increasing the decoder circuit speed. Additionally, memories of the present invention allow for the select lines to be formed on separate integrated circuit process layers and therefore allow them to be routed to the individual sense amplifier pass transistors without increasing the size or complexity of the memory array.

In one embodiment of the present invention, both the read and write path Y multiplexers or "Y-MUXs" of a Flash memory array are coupled to a column decoder through a metal-3 process layer that runs on top of the array ground connection. This allows full decoding of the column address in the column decoder with routing of signal lines carrying the fully decoded column address through the metal-3 layer, saving array space and simplifying the logic design and increasing the speed of the column decode circuit. This also allows for the utilization of single pass transistors in the read and write Y-MUXs to couple to the selected read or write sense amplifiers, reducing input and output resistance, increasing column access speed, and allowing for shorter read and write paths. One embodiment of the present invention utilizes two sets of metal-3 column decode lines of 128 lines each, one set for read access and one set for write access, that each select 16 bits of data. Embodiments of the present invention also allow for the column decoder to be placed near to the address buffers, improving signal strength and speed, allowing decode to occur at higher speed.

Figure 1:
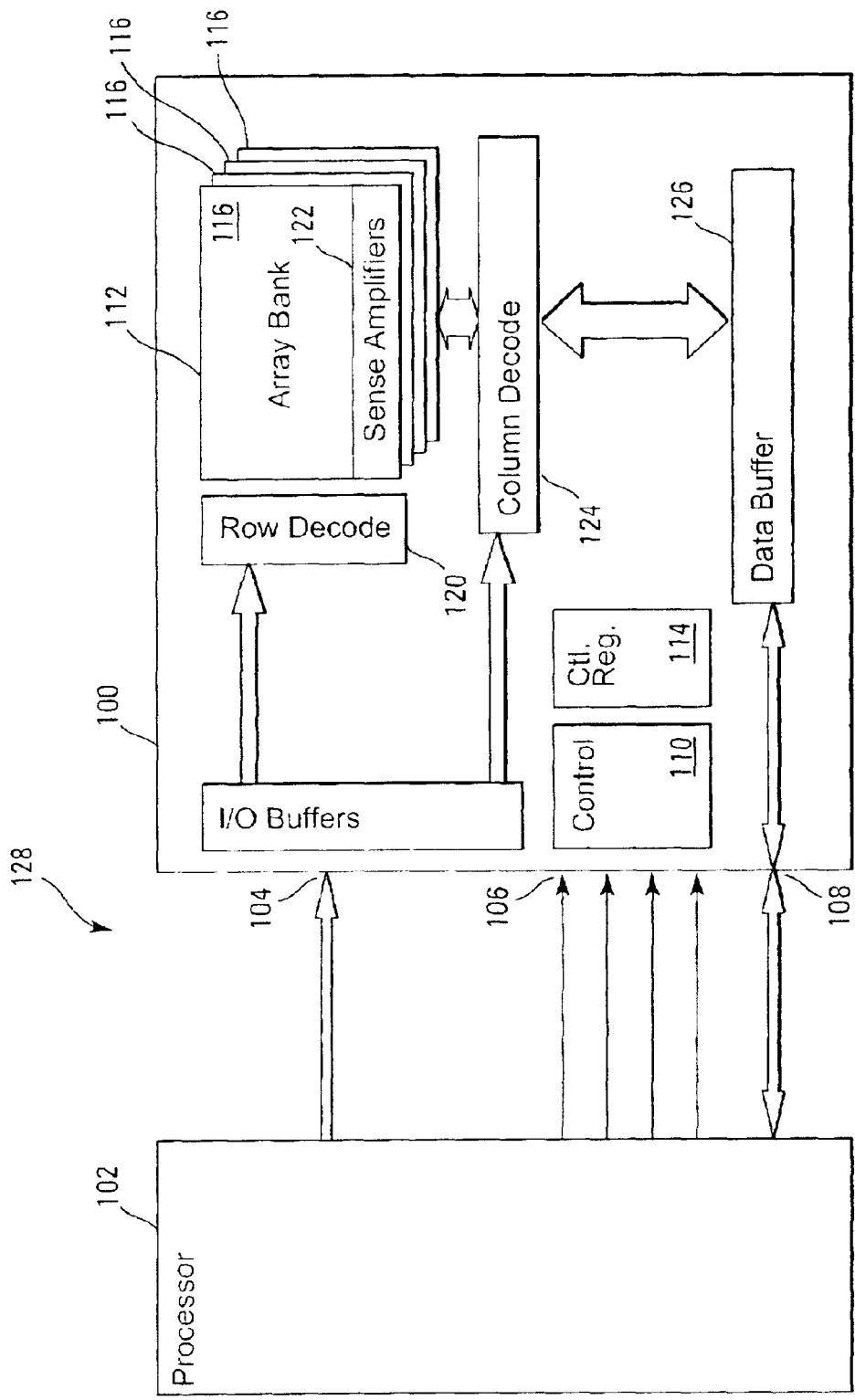
FIG. 1 is a simplified diagram of a system incorporating a processor and a Flash memory device of the prior art.
Figure 2A:
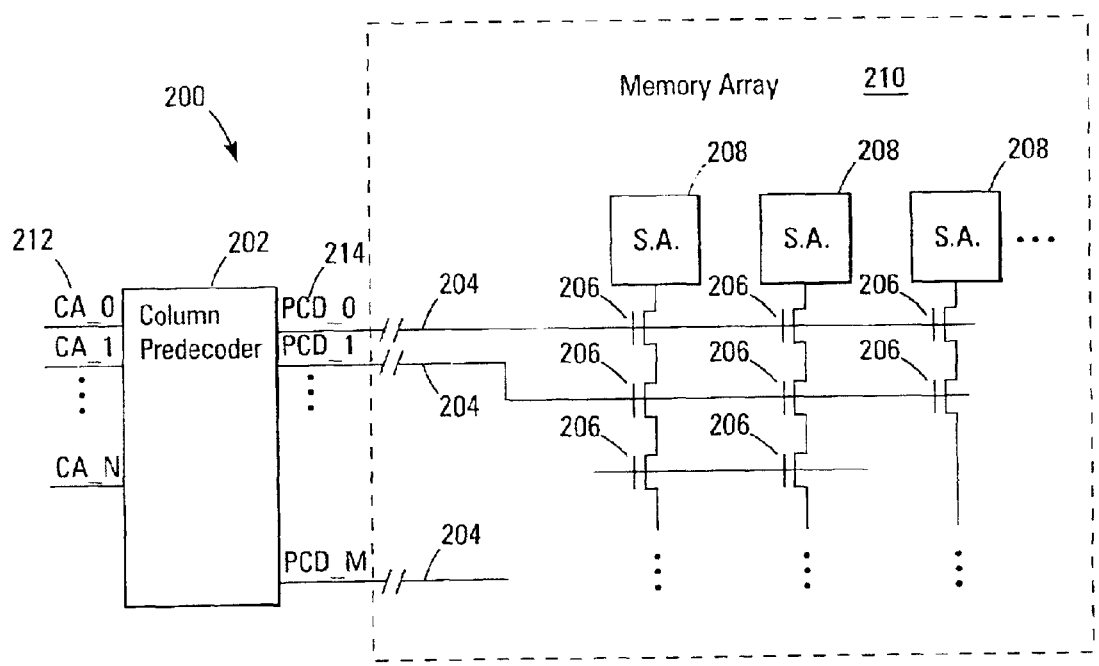
FIGS. 2A and 2B are simplified diagrams of full and partial column decode circuits.

FIG. 2A is a simplified diagram of a memory 200 of the prior art that contains a column decoder circuit 202 and a memory array 210 that utilizes partial decoding of the column address to select the appropriate sense amplifiers to couple to the data bus (not shown). In FIG. 2A, the column decoder circuit 202 is coupled to pass transistors 206 of the memory array 210 with a succession of partially decoded column select lines or decode lines 204. A set of two or more pass transistors 206 are coupled in series to each sense amplifier 208 of the memory array 210 that allow it to be selected when they are enabled. During a memory access, the column decoder circuit 202 receives a column address (CA_0:CA_N) 212 and partially decodes the asserted address. The partially decoded column address (PCD_0:PCD_M) 214 generated by the column decoder circuit 202 is coupled via the column select lines 204 to the pass transistors 206 of the memory array 210. If all of the series coupled pass transistors 206 of an individual sense amplifier 208 are turned on by the partially decoded column address 214 placed on the column select lines 204, the sense amplifier is selected and is coupled to the data bus (not shown) through the pass transistors 206.

Figure 2B:
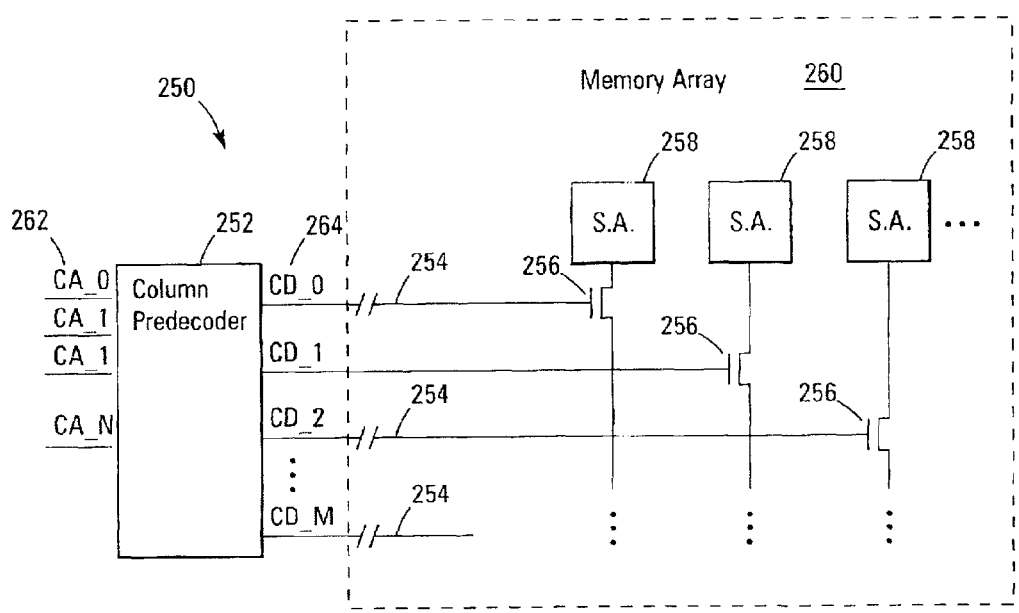

FIG. 2B is a simplified diagram of a memory 250 of an embodiment of the present invention that contains a column decoder circuit 252 and a memory array 260 that utilizes full decoding of the column address to select the appropriate sense amplifiers to couple to the data bus (not shown). In FIG. 2B, the column decoder circuit 252 is coupled to pass transistors 256 of the memory array 260 with a succession of fully decoded column select lines or decode lines 254. A single pass transistor 256 is coupled to each sense amplifier 258 of the memory array 260 that allow it to be selected when the transistor is enabled. During a memory access, the column decoder circuit 252 receives a column address (CA_0:CA_N) 262 and decodes the asserted address. The fully decoded column address (CD_0:CD_M) 264 generated by the column decoder circuit 252 is coupled via the column select lines 254 to the pass transistors 256 of the memory array 260. If a pass transistor 256 of an individual sense amplifier 258 is turned on by the fully decoded column address 264, the sense amplifier is selected and is coupled to the data bus (not shown) through the pass transistor 256.

It is noted that the column decode circuit 252 of FIG. 2B is simpler and contains fewer levels of logic gates than the partial column decode circuit 202 of FIG. 2A, allowing the circuit to operate faster and be implemented in a smaller circuit space on the integrated circuit chip. It is also noted that the single pass transistors 256 of FIG. 2B present less circuit resistance and therefore allow for faster operation of the memory device.

FIG. 3A is a simplified diagram of a memory array 302 of one 4 megabit Flash memory device 300 embodiment of the present invention. In FIG. 3A, the memory array 302 contains 4 memory banks (MB0, MB1, MB2, and MB3) 304 of 256 rows, 4 redundant rows, and 4096 columns each that are each divided into four quarter banks (Q0, Q1, Q2, and Q3) 306 for a total of 16 quarter bank memory array sections 304. Every four quarter bank memory array sections 304 (all Q0's, Q1's, Q2's, or Q3's) are coupled to 2048 (2 k) sense amplifiers 310 via 2048 (2 k) pass transistors 312, also known as Y multiplexers or "Y-MUXs". Every four quarter bank memory array sections 304 (all Q0's, Q1's, Q2's, or Q3's) are also coupled to 2048 (2 k) write sense amplifiers 314 via 2048 (2 k) pass transistors 316, also known as write multiplexers or "WMUXs". Row address decoders or X decoders 320 decode the asserted row address of the memory access and select individual rows of the 16 quarter bank memory array sections 306, and couple local bitlines (not shown) that are coupled to individual floating gate memory cells (not shown) of each quarter bank memory array section 304 to global bitlines (not shown) via block pass decoders 322 and block pass transistors 324. The column decode circuit 326 is located adjacent to the memory array 302 and is coupled to the 2 k of pass transistors (Y-MUX) 312 of the sense amplifiers 310 and to the to the 2 k of pass transistors (WMUX) 316 of the write sense amplifiers 314 via 128 read column select lines and 128 write column select lines (not shown) that run through the memory array 302 from the column decode circuit 326.

In operation, the row decode circuit 320 and block pass decoders 322 decode the asserted row address of a memory access and select the desired row from a memory bank 304 of the memory array 302 quarter bank sections 306. The activated memory cells on the selected rows output data signals that are coupled from local bit lines (not shown) to global bit lines (not shown) by block pass transistors 324. The column decode circuit 326 decodes the asserted column address of the memory access and asserts a fully decoded column address on the column select lines (not shown). During a read access the column decode circuit 326 selects and activates a read column select line of the 128 read column select lines (not shown). The selected read column select line selects 16 sense amplifiers 310 and couples them to an output data bus (not shown) via 16 pass transistors of the Y-MUX 312 to generate a sixteen bit data word. The sixteen bit output data word on the output bus is then truncated at a later point to the exact eight bits, if desired, for output from the Flash memory device 300. Alternatively, the 16 bit data word on the output bus is output from the memory device. During a write access the row is selected as above and the column decode circuit 326 selects and activates a write column select line of the 128 write column select lines (not shown). The selected write column select line selects 16 write sense amplifiers 314 and couples them to a sixteen bit input data bus (not shown) via 16 pass transistors of the WMUX 316 to write a sixteen bit data word to the desired row of a memory bank 304 of the memory array 302 quarter bank sections 306. As stated above, the write access is then followed by a read access to verify the data written to the memory array 302.

It is noted that a 8 bit data word can be selected in the memory 300 of FIG. 3A by incorporating extra column select lines into the memory array 302 and column decode circuit 326. It is also noted that other configurations of column decode circuits, column select lines, and memory arrays of embodiments of the present invention are possible and should be apparent to those skilled in the art with the benefit of this disclosure.

FIG. 3B is a simplified diagram of a memory bank 352 of one Flash memory device 350 embodiment of the present invention showing sense amplifiers. In FIG. 3B, the memory array 352 contains 4 one megabit memory banks (MB0, MB1, MB2, and MB3) 354 of 256 rows and 4096 (4 k) columns each. Each memory bank 354 is coupled to sense amplifiers 360 via pass transistors or Y-MUX's 362. Row address decoders or X decoders 370 decode the asserted row address of the memory access and select individual rows of the memory banks 354, and couple local bitlines 380 that are coupled to individual floating gate memory cells (not shown) to global bitlines 382 via block pass decoders 372 and block pass transistors 374. The column decode circuit (not shown) is coupled to the pass transistors (Y-MUX) 362 of the sense amplifiers 360 via read column select lines (not shown) that run through the memory array 352 from the column decode circuit.

In operation, the row decode circuit 370 and block pass decoders 372 decode the asserted row address of a memory access and select the desired row from a memory bank 354 of the memory array 352. The activated memory cells (not shown) on the selected rows output data signals that are coupled from local bit lines 380 to global bit lines 382 by block pass transistors 374. The column decode circuit (not shown) decodes the asserted column address of the memory access and asserts a fully decoded column address on the column select lines (not shown). During a read access the column decode circuit selects and activates a column select line. The selected read column select line selects sense amplifiers 360 and couples a single sense amplifier 360 to each signal line of the output data bus 384 via pass transistors of the Y-MUX 362. The output data word on the output bus 384 is then formatted for output from the data interface (not shown) of the Flash memory device 350 by the data buffer (not shown).

Figure 4:
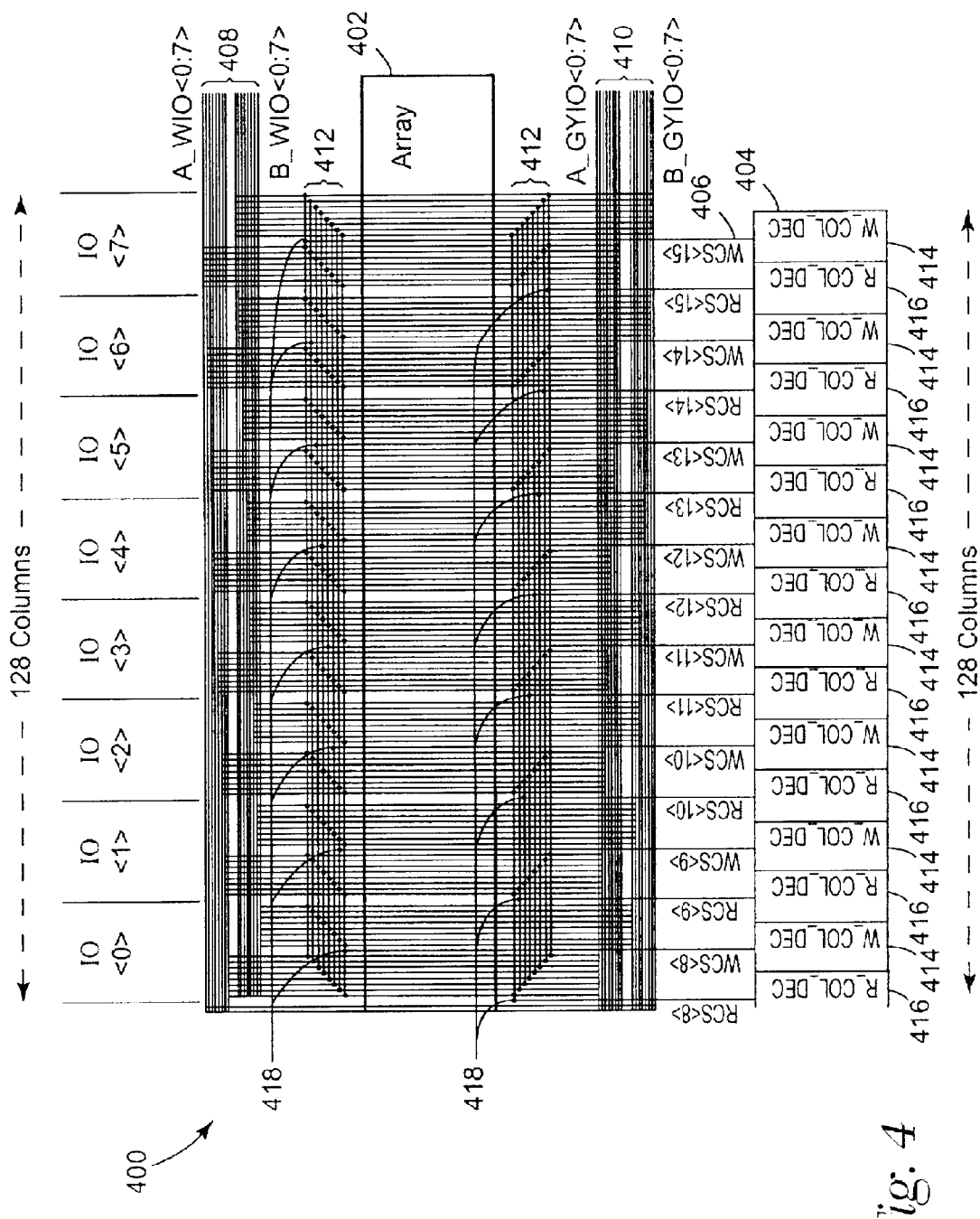
FIG. 4 is a simplified diagram of memory array bank and column decode circuit embodiment of the present invention.

FIG. 4 is a simplified diagram of a memory array 402 of a memory device 400 embodiment of the present invention showing column decoder circuit 404 and column select lines 406. In FIG. 4, a memory array 402 containing write sense amplifiers and read amplifiers (not shown) is coupled to a 16 bit write input/output (I/O) bus 408 and a 16 bit read I/O bus 410, respectively, by single pass transistors 412. The pass transistors 412 are activated by a column decode circuit 404 via column select lines 406. The column decode circuit outputs 128 write column select lines 414 and 128 read column select lines 416. Each read and write column select line 414, 416 couple to 418 and drive 16 pass transistors 412. On a read memory access the column decoder circuit 404 activates a single read column select line 416. The active read column select line in turn activates 16 pass transistors 412 and couple a single read sense amplifier (not shown) output of the memory array 402 to each signal line of the 16 bit read I/O bus (A_GYIO<0:7>, B_GYIO<0:7>) 410. On a write memory access the column decoder circuit 404 activates a single write column select line 414. The active write column select line in turn activates 16 pass transistors 412 and couple a single write sense amplifier (not shown) input of the memory array 402 to each signal line of the 16 bit write I/O bus (A_WIO<0:7>, B_WIO<0:7>) 408.

Figure 5:
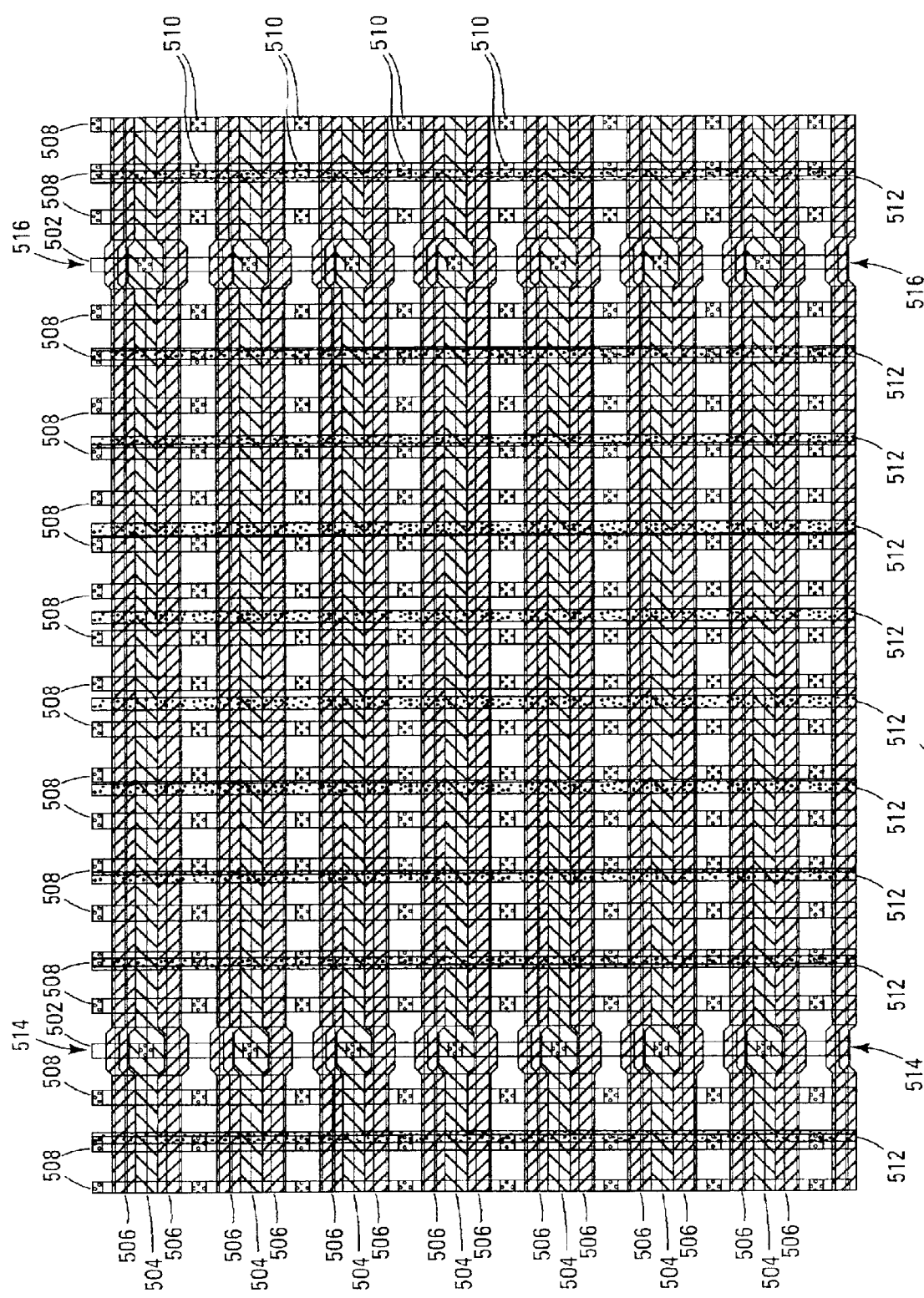
FIG. 5 is a simplified diagram of a memory array of an embodiment of the present invention.

FIG. 5 is a simplified diagram of one embodiment of the present invention showing process layers of a Flash memory array 500. In FIG. 5, metal ground lines 502 are spaced every 16 floating gate memory cells (or every 16 memory columns). The source polysilicon (poly) lines 504 are coupled or "strapped" to the metal ground lines 502 and are coupled to 16 floating gate memory cells between each set of metal ground lines 502 to provide ground connection for the sources of the floating gate memory cells. Row address word lines are implemented in poly conductor 506 and are coupled to the gates of a row of floating gate memory cells. The poly row address word lines 506 are strapped to metal word lines (not shown) implemented in the metal 2 process layer every 1024 (1 k) of floating gate memory cells. Local bitlines 508 are implemented in metal 1 process layer and couple the drain outputs of each column of floating gate memory cells to read or write sense amplifiers (not shown)

via global bitlines 512 implemented in the metal 3 process layer and block pass transistors (not shown). Each local bitline 508 couples the global bitline 512 to the drain of two floating gate memory cells for each contact 510. Read column select lines 514 and Write column select lines 516 are implemented in the metal 3 process layer over the top of the metal ground lines 502 and are spaced in an alternating manner every 16 column widths (every 16 floating gate memory cells). The read and write column select lines repeat in sequence every 256 memory columns. Each read and write column select line 514, 516 couple to a horizontal metal 2 process layer line (not shown) that travels 256 column widths (floating gate memory cell widths) and couples the read and write column select line 514, 516 to 8 pass transistors (not shown). Every 32 floating gate memory cells of the Flash memory array 500 group as one input/output (I/O) line (not shown) and an active read or write column decode line 514, 516 will select the sense amplifier output of one of the group of 32 to couple to the I/O line for 8 I/O lines per main array memory block (not shown).

It is noted that alternative memory and Flash memory array column decode circuit arrangements utilizing embodiments of the present invention are possible and should be apparent to those skilled in the art with the benefit of the present disclosure.

CONCLUSION

An improved memory device column decode apparatus and method has been described that incorporates a reduced logic level column address decoder that fully decodes the column address and couples individual sense amplifiers to input or output busses with single pass transistors to provide for increased operation speed and lower sense amplifier resistance. The improved memory device column decode apparatus and method reduces column decode circuit and memory array size allowing for efficient memory array sizing and implementation. Additionally, the improved memory device column decode apparatus and method can incorporate fully decoded column select lines on a separate process layer of the memory array further reducing implementation size.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A column decoder circuit, comprising:
   a memory array with a plurality of sense amplifiers;
   a decoder circuit adapted to receive and fully decode a column address;
   a plurality of column select lines coupled to the decoder circuit, wherein the column select lines are routed across the memory array on a process layer of the memory array that is separate from an array ground of the memory array and selectively couple the plurality of sense amplifiers to an array output bus by activating a single pass transistor coupled to each sense amplifier.

2. The column decoder circuit of claim 1, further comprising:
   a plurality of write amplifiers, wherein the decoder circuit selectively couples the plurality of write amplifiers to an array input bus by activating a single pass transistor coupled to each write amplifier via the plurality of the column select lines.

3. The column decoder circuit of claim 1, wherein the process layer is a metal-3 layer.

4. The column decoder circuit of claim 1, wherein the column select lines are formed of metal.

5. The column decoder circuit of claim 1, wherein the plurality of column select lines are routed into the memory array such that each column select line is separated by a space of 16 memory cells from the next column select line.

6. The column decoder circuit of claim 1, wherein the decoder circuit selects 16 sense amplifiers of the plurality of sense amplifiers for each memory access.

7. The column decoder circuit of claim 1, wherein the decoder circuit selects 8 sense amplifiers of the plurality of sense amplifiers for each memory access.

8. The column decoder circuit of claim 1, wherein each column select line of a memory array bank of a plurality of memory banks of the memory array selects a single set of sense amplifiers from the plurality of sense amplifiers.

9. The column decoder circuit of claim 1, wherein each memory array bank of a plurality of memory banks of the memory array contains 256 column select lines.

10. The column decoder circuit of claim 1, wherein each memory array bank of a plurality of memory banks of the memory array contains a first set of 128 column select lines that each select a read sense amplifier and a second set of 128 column select lines that each select a write sense amplifier of a plurality of write amplifiers coupled to the memory array bank.

11. The column decoder circuit of claim 10, wherein each column select line selects 16 sense amplifiers for each memory access.

12. A Flash memory Y-Mux circuit, comprising:
   a memory array with a plurality of sense amplifiers;
   an address interface coupled to an address decoder; and
   a plurality of decode lines coupled to the address decoder and routed on a conductor process layer of the memory array that is separate from an array ground of the memory array, wherein a single pass transistor is coupled to each sense amplifier and each decode line is coupled to at least one pass transistor.

13. The Flash memory Y-Mux circuit of claim 12, wherein each decode line is coupled to 8 pass transistors.

14. The Flash memory Y-Mux circuit of claim 12, wherein each decode line is coupled to 16 pass transistors.

15. The Flash memory Y-Mux circuit of claim 12, wherein the address decoder is adapted to fully decode an address received from the address interface.

16. The Flash memory Y-Mux circuit of claim 12, wherein the conductor process layer is a metal process layer.

17. The Flash memory Y-Mux circuit of claim 12, further comprising:
   a plurality of write amplifiers coupled to the memory array, wherein a single pass transistor is coupled to each write sense amplifier and a decode line of the address decoder is coupled to at least one single pass transistor.

18. The Flash memory Y-Mux circuit of claim 12, wherein each decode line of the memory array selects a single set of sense amplifiers from the plurality of sense amplifiers.

19. The Flash memory Y-Mux circuit of claim 12, wherein each memory array bank of a plurality of memory banks of the memory array contains 256 decode lines.

20. The Flash memory Y-Mux circuit of claim 12, wherein each memory array bank of a plurality of memory banks of the memory array contains a first set of 128 decode lines that each select a sense amplifier and second set of 128 decode lines that each select a write sense amplifier of a plurality of write amplifiers coupled to the memory array.

21. A Flash memory device, comprising:
   a memory array containing a plurality of floating gate memory cells;
   an address interface coupled to a row address decoder and a column address decoder; and
   a plurality of column decode lines coupled to the column address decoder and routed on a conductor process layer of the memory array that is separate from an array ground of the memory array, wherein the column decode circuit is adapted to fully decode a column address and wherein each column decode line is coupled to a single pass transistor.

22. The Flash memory device of claim 21, wherein each column decode line is coupled to 8 pass transistors.

23. The Flash memory device of claim 21, wherein each column decode line is coupled to 16 pass transistors.

24. The Flash memory device of claim 21, wherein the conductor process layer is a metal process layer.

25. The Flash memory device of claim 21, further comprising:
   a plurality of write amplifiers coupled to the memory array, wherein a single pass transistor is coupled to each write sense amplifier and a column decode line of the column address decoder is coupled to at least one single pass transistor.

26. The Flash memory device of claim 21, wherein each column decode line of the memory array selects a single set of sense amplifiers from the plurality of sense amplifiers.

27. The Flash memory device of claim 21, wherein each memory array bank of a plurality of memory banks of the memory array contains 256 column decode lines.

28. The Flash memory device of claim 21, wherein each memory array bank of a plurality of memory banks of the memory array contains a first set of 128 column decode lines that each select a sense amplifier and a second set of 128 column decode lines that each select a write sense amplifier of a plurality of write amplifiers coupled to the memory array.

29. A non-volatile memory array, comprising:
   a plurality of sense amplifiers;
   an address decoder; and
   a plurality of decode lines coupled to the address decoder and routed into the memory array on a conductor process layer of the memory array that is separate from an array around of the memory array, wherein a single pass transistor is coupled to each sense amplifier and wherein each decode line is coupled to at least one pass transistor.

30. The non-volatile memory array of claim 29, wherein the conductor process layer is a metal-3 process layer of the memory array.

31. The non-volatile memory array of claim 29, further comprising:
   a plurality of write amplifiers coupled to the non-volatile memory array, wherein a single pass transistor is coupled to each write sense amplifier and a decode line of the address decoder is coupled to at least one single pass transistor.

32. The non-volatile memory array of claim 29, wherein each decode line of the memory array selects a single set of sense amplifiers from the plurality of sense amplifiers.

33. The non-volatile memory array of claim 29, wherein each memory array bank of a plurality of memory banks of the non-volatile memory array contains 256 decode lines.

34. The non-volatile memory array of claim 29, wherein each memory array bank of a plurality of memory banks of the non-volatile memory array contains a first set of 128 decode lines that each select a sense amplifier and a second set of 128 decode lines that each select a write sense amplifier of a plurality of write amplifiers coupled to the non-volatile memory array.

35. A Flash memory device, comprising:
   a memory array with a plurality of memory banks, wherein each memory bank has a plurality of read sense amplifiers and a plurality of write sense amplifiers;
   a data input bus coupled to a data buffer, wherein each write sense amplifier is coupled to the data input bus with a single pass transistor;
   a data output bus coupled to the data buffer, wherein each read sense amplifier is coupled to the data output bus with a single pass transistor;
   an address interface coupled to a row address decoder and a column address decoder, wherein the column address decoder is a single logic level and is adapted to fully decode the column address; and
   a plurality of column select lines coupled to the column address decoder, wherein each column select line is coupled to at least one pass transistor, and wherein each column select line is formed in a metal layer of the memory array that is separate from an array ground of the memory array.

36. The Flash memory device of claim 35, wherein the metal layer is a metal-3 layer.

37. The Flash memory device of claim 35, wherein each memory array bank contains a first set of 128 column decode lines that each couple a set read sense amplifiers of the plurality of read sense amplifiers to the output data bus and a second set of 128 column decode lines that each couple a set of write sense amplifiers of the plurality of write amplifiers to the input bus.

38. The Flash memory device of claim 37, wherein the each memory access selects a set of 16 read or write sense amplifiers.

39. A system, comprising:
   a processor; and
   a Flash memory device coupled to the processor, wherein the Flash memory device comprises:
      a memory array containing a plurality of floating gate memory cells;
      an address interface coupled to a row address decoder and a column address decoder; and
      a plurality of column decode lines coupled to the column address decoder and muted into the memory array on a conductor process layer of the memory array that is separate from an array ground of the memory array, wherein the column decode circuit is adapted to fully decode a column address and wherein each column decode line is coupled to a single pass transistor.

40. The system of claim 39, wherein the conductor process layer of the memory array is a metal layer.

41. The system of claim 39, further comprising:
   a plurality of write amplifiers coupled to the memory array of the Flash memory, wherein a single pass transistor is coupled to each write sense amplifier and a column decode line of the column address decoder is coupled to at least one single pass transistor.

42. The system of claim 39, wherein each column decode line of the Flash memory selects a single set of sense amplifiers from the plurality of sense amplifiers.

43. The system of claim 39, wherein each memory array bank of a plurality of memory banks of the memory array of the Flash memory contains 256 column decode lines.

44. The system of claim 39, wherein each memory array bank of a plurality of memory banks of the memory array of the Flash memory contains a first set of 128 column decode lines that each select a sense amplifier and a second set of 128 column decode lines that each select a write sense amplifier of a plurality of write amplifiers coupled to the memory array.

45. A method of operating a Flash memory device, comprising:
   receiving a memory access containing a memory address at a memory device;
   decoding the memory address with an address decoder; and
   accessing a memory array of the Flash memory device by activating at least one decode select line of a plurality of decode select lines routed into the memory array on a conductor process layer of the memory array that is separate from an array ground of the memory array, wherein each of the at least one decode select lines selectively couples at least one sense amplifier to a data bus with a pass transistor.

46. The method of claim 45, further comprising:
   accessing a memory array of the Flash memory device by activating at least one decode select line of a plurality of decode select lines, wherein each of the at least one decode select lines selectively couples at least one write sense amplifier input to a data bus with a pass transistor.

47. The method of claim 45, wherein accessing a memory array of the Flash memory device by activating at least one decode select line of a plurality of decode select lines, wherein each of the at least one decode select lines selectively couples at least one sense amplifier to a data bus with a pass transistor further comprises accessing a memory array of the Flash memory device by selectively coupling 16 sense amplifiers to a data bus with a single pass transistor for each sense amplifier.

48. The method of claim 45, wherein accessing a memory array of the Flash memory device by activating at least one decode select line of a plurality of decode select lines, wherein each of the at least one decode select lines selectively couples at least one sense amplifier to a data bus with a pass transistor further comprises accessing a memory array of the Flash memory device by selectively coupling 8 sense amplifiers to a data bus with a single pass transistor for each sense amplifier.

49. A method of making a Flash memory device, comprising:
   forming a memory array with a plurality of sense amplifiers that each couple to a data bus with a single pass transistor;
   forming an address interface;
   forming an address decode circuit coupled to the address interface; and
   forming a plurality of decode select lines on a conductor process layer of the memory array that is separate from an array ground of the memory array, each decode select line coupled to the address decoder and at least one of the pass transistors.

50. The method of claim 49, wherein the conductor process layer is a metal process layer of the memory array.

51. A method of operating a Flash memory device, comprising:
   receiving a memory access containing a column address at a memory device;
   fully decoding the column address with a column address decoder; and
   accessing a memory array of the Flash memory device by activating at least one decode select line of a plurality of decode select lines, wherein each of the at least one decode select lines is routed through a metal process layer over the memory array and selectively couples at least one sense amplifier to a data bus with a Y-MUX, wherein the metal process layer is separate from an array ground of the memory array.

52. The method of claim 51, wherein the metal process layer is a metal-3 process layer over the memory array.

53. The method of claim 51, wherein accessing the memory array of the Flash memory device by activating the at least one decode select line of the plurality of decode select lines, wherein each of the at least one decode select lines is routed through the metal process layer over the memory array and selectively couples the least one sense amplifier to the data bus with the Y-MUX further comprises accessing the memory array by selectively coupling the at least one sense amplifier to the data bus with the Y-MUX, wherein the Y-MUX couples the at least one sense amplifier to the data bus with a single pass transistor.

54. The method of claim 51, wherein accessing the memory array of the Flash memory device by activating the at least one decode select line of the plurality of decode select lines, wherein each of the at least one decode select lines is routed through the metal process layer over the memory array and selectively couples the at least one sense amplifier to the data bus with the Y-MUX further comprises accessing the memory array of the Flash memory device by selectively coupling 8 sense amplifiers to the data bus with the Y-MUX.

55. A Flash memory device, comprising:
   a memory array containing a plurality of floating gate memory cells;
   a plurality of bit lines, wherein each bit line is coupled to a sense amplifier and to a plurality of outputs of the plurality of floating gate memory cells;
   an address interface coupled to a row address decoder and a column address decoder;
   a plurality of column decode lines coupled to the column address decoder, wherein the column address decoder is adapted to fully decode a column address and wherein each column decode line is routed through a metal process layer of the memory array that is separate from an array around of the memory array; and
   a Y-MUX, wherein each Y-MUX is coupled to one or more column decode lines and selectively couples a plurality of the sense amplifiers to a bus in response to an output of column address decoder coupled via the column decode lines.

56. The Flash memory device of claim 55, wherein each Y-MUX couples each sense amplifier to the bus via a single pass transistor.

57. The Flash memory device of claim 55, wherein the metal layer is a metal-3 process layer.

58. The Flash memory device of claim 55, wherein each column decode line is coupled to 8 pass transistors of the Y-MUX.

59. The Flash memory device of claim 55, wherein each column decode line is coupled to 16 pass transistors of the Y-MUX.

60. The Flash memory device of claim 55, wherein each sense amplifier further comprises a write sense amplifier and a read sense amplifier coupled to the bit line, wherein each write sense amplifier is coupled to an input data bus via a WMUX and each read sense amplifier is coupled to an output data bus via the Y-MUX.

61. The Flash memory device of claim 55, wherein each memory array bank of a plurality of memory banks of the memory array contains a first set of 128 column decode lines that each select one or more read sense amplifiers and a second set of 128 column decode lines that each select one or more write sense amplifiers.

* * * * *

UNITED STATES PATENT AND TRADEMARK OFFICE
CERTIFICATE OF CORRECTION

PATENT NO. : 6,747,898 B2
DATED : June 8, 2004
INVENTOR(S) : Ebrahim Abedifard

It is certified that error appears in the above-identified patent and that said Letters Patent is hereby corrected as shown below:

Column 1,
Line 58, "modern manufacturer to support new protocols as they" should read -- modem manufacturer to support new portocols as they --.

Column 11,
Line 48, "an array around of the memory array, wherein a single" should read -- an array ground of the memory array, wherein a single --.

Column 12,
Line 50, "column address decoder and muted into the memory" should read -- column address decoder and routed into the memory --.

Column 14,
Line 12, "layer is a metal-3 process layer over the memory array" should read -- layer is a metal-3 process layer. --.
Line 18, "memory array and selectively couples the least one sense" should read -- memory array and selectively couples the at least one sense --.
Line 47, "from an array around of the memory array;" should read -- from an array ground of the memory array; --.

Signed and Sealed this

Twenty-eighth Day of February, 2006

JON W. DUDAS
*Director of the United States Patent and Trademark Office*